United States Patent [19]
Tan

[11] Patent Number: 6,137,711
[45] Date of Patent: Oct. 24, 2000

[54] FERROELECTRIC RANDOM ACCESS MEMORY DEVICE INCLUDING SHARED BIT LINES AND FRAGMENTED PLATE LINES

[75] Inventor: Charles M. C. Tan, Santa Clara, Calif.

[73] Assignee: Agilent Technologies Inc., Palo Alto, Calif.

[21] Appl. No.: 09/335,204

[22] Filed: Jun. 17, 1999

[51] Int. Cl.[7] .................................................. G11C 11/22
[52] U.S. Cl. ............................................. 365/145; 365/65
[58] Field of Search ..................................... 365/145, 196, 365/230.06, 189.04, 230.03, 63, 65

[56] References Cited

U.S. PATENT DOCUMENTS 5,400,275  3/1995  Abe et al. ................................ 365/145
5,524,093  6/1996  Kuroda .................................... 365/145

*Primary Examiner*—David Nelms
*Assistant Examiner*—Thong Le

[57] ABSTRACT

A ferroelectric random access memory ("FeRAM") device includes shared bit lines and fragmented plate lines. Each bit line is shared by a group of two or more ferroelectric capacitors. Each group also includes at least one access transistor, which may be shared by more than one ferroelectric capacitor. During read and write operations, capacitors in a group are selected by the plate lines and a plate line decoder.

20 Claims, 4 Drawing Sheets

FERROELECTRIC RANDOM ACCESS MEMORY DEVICE INCLUDING SHARED BIT LINES AND FRAGMENTED PLATE LINES

BACKGROUND OF THE INVENTION

The invention relates to random access memory. More specifically, the invention relates to a non-volatile ferroelectric random access memory device.

Ferroelectric random access memory ("FeRAM") is a type of non-volatile memory that is being considered for use in computers. Near-term goals for FeRAM include using it to replace flash memory in computers. As with flash memory, FeRAM is non-volatile. However, FeRAM is less expensive than flash memory and it operates at lower voltages. Additionally, FeRAM is much faster than flash memory. Whereas flash type EEPROM cells can take microseconds to write and milliseconds to erase, FeRAM devices can take only nanoseconds to read and write. In fact, access times of FeRAM rival those of dynamic random access memory and static random access memory.

An FeRAM device includes an array of memory cells. A typical memory cell includes a single ferroelectric capacitor and a single access transistor. The ferroelectric capacitor has two stable polarization states, which correspond to binary levels. Moreover, the ferroelectric capacitor retains its state without electric power.

A typical FeRAM device also includes a word line for each row of the memory cell array, a bit line for each column of the memory cell array, and a plate line that is common to all of the memory cells in the array. In each memory cell, a gate of the access transistor is connected to a corresponding word line, a drain-source path of the access transistor is connected between the ferroelectric capacitor and a corresponding bit line, and the ferroelectric capacitor is connected between the transistor drain-source path and the common plate line.

A memory cell is accessed by selecting the word and bit lines to which that cell is connected. Selecting the corresponding word line causes the access transistor to turn on, and selecting the corresponding bit line allows current to flow to the corresponding ferroelectric capacitor. For example, a first polarization state can be written to the ferroelectric capacitor by driving the selected bit line high and the plate line low, and a second polarization state can be written to the capacitor by driving the plate line high and the selected bit line low. A polarization state can be read from the ferroelectric capacitor by turning on the selected word line and sensing charge on the selected bit line.

Whether or not the FeRAM eventually replaces with flash memory will depend upon factors such as size and cost of the FeRAM device, reliability of the FeRAM device, and reproducibility of the FeRAM device.

One objective of FeRAM design is to increase packaging density of the FeRAM device. Since memory cell density has a direct influence on chip cost, increasing the packaging density would reduce chip cost.

Another objective is to reduce cross talk between the bit lines. When data is accessed from a typical FeRAM device in m-bit words, multiple bit lines are accessed simultaneously. The signal on the bit lines is smaller than on the word lines. The resulting signal-to-noise ratio on the bit lines can present problems. Reducing the cross talk would increase reliability of accessing data from the memory cells.

Yet another objective is to reduce the number of elements on the FeRAM device. Reducing the number of elements can also reduce size and cost of the chip. Reducing the number of elements can also increase reproducibility of the device for high volume manufacture.

SUMMARY OF THE INVENTION

According to one aspect of the invention, a ferroelectric random access memory device includes a plurality of rows of ferroelectric capacitors and access transistors; a plurality of plate lines; a plurality of bit lines; and a plate line decoder connected to the plate lines. Each row includes at least one group of ferroelectric capacitors coupled to the same bit line by at least one access transistor. However, the ferroelectric capacitors of each said group are connected to different plate lines. A ferroelectric capacitor in a group is selected by the plate line decoder and the plate line connected to the selected capacitor. This allows the same bit line to be shared by all of the capacitors in a group.

The shared bit lines allow column wide isolation, which reduces cross talk and/or allows smaller memory cells to be used. Reducing the cross talk improves reliability of accessing memory cells, and using smaller memory cells increases packaging density, which reduces chip cost. Bit line sharing also reduces the number of bit lines that are used, which lowers the cost and reproducibility of the device.

According to another aspect of the invention, a row of memory cells of a ferroelectric random access memory device includes a plurality of memory cell pairs, each memory cell pair including a first memory cell and a second memory cell; at least one first plate line; at least one second plate line; and a plurality of shared bit lines, each bit line corresponding to a memory cell pair in the row. The first memory cell of each pair is connected between its corresponding shared bit line and a first plate line; and the second memory cell of each pair is connected between its corresponding shared bit line and a second plate line. Thus, each memory cell pair shares its corresponding bit line.

According to yet another aspect of the invention, a memory cell of a ferroelectric random access memory device includes a first ferroelectric capacitor connected between a first plate line and a junction; a second ferroelectric capacitor connected between a second plate line and the junction; and an access transistor having its controlled current path connected between a bit line and the junction. Thus, the corresponding bit line and the access transistor are shared by the first and second ferroelectric capacitors.

Other aspects and advantages of the present invention will become apparent from the following detailed description, taken in conjunction with the accompanying drawings, illustrating by way of example the principles of the invention.

DETAILED DESCRIPTION OF THE INVENTION

Figure 1:
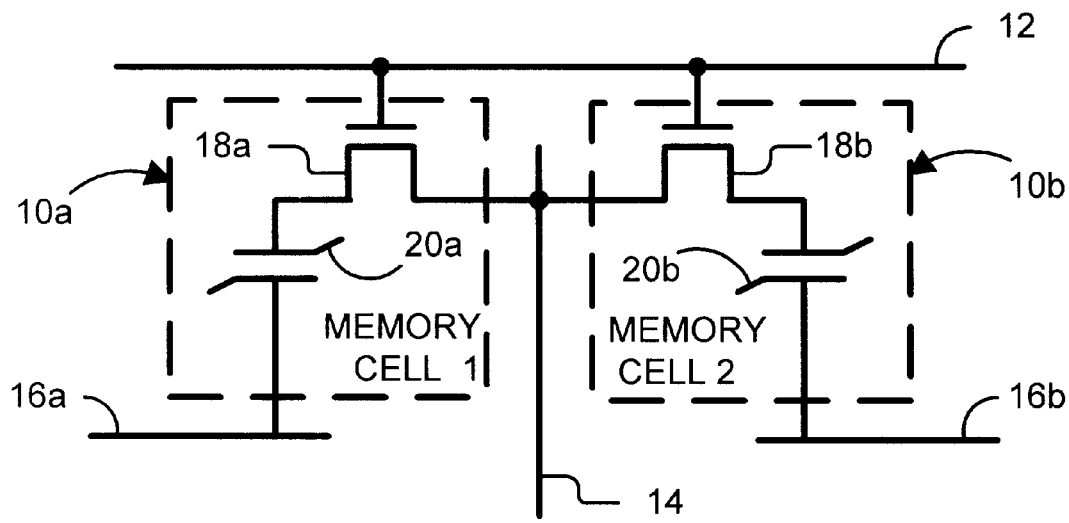
FIG. 1 is an illustration of a pair of memory cells connected to a shared bit line and fragmented plate lines.

As shown in the drawings for purposes of illustration, the present invention is embodied in an FeRAM device having shared bit lines and fragmented plate lines. The shared bit lines allow column wide isolation, which reduces cross talk and/or allows smaller memory cells to be used. Reducing the cross talk improves reliability of accessing memory cells, and using smaller memory cells increases packaging density, which reduces chip cost. Bit line sharing also reduces the number of bit lines that are used, which lowers the cost and reproducibility of the FeRAM device.

Reference is now made to FIG. 1, which shows first and second adjacent memory cells 10a and 10b connected to a common word line 12, a shared bit line 14 and fragmented plate lines 16a and 16b. The first memory cell 10a includes a first access transistor 18a and a first ferroelectric capacitor 20a. The second memory cell 10b includes a second access transistor 18b and a second ferroelectric capacitor 20b.

Figure 2:
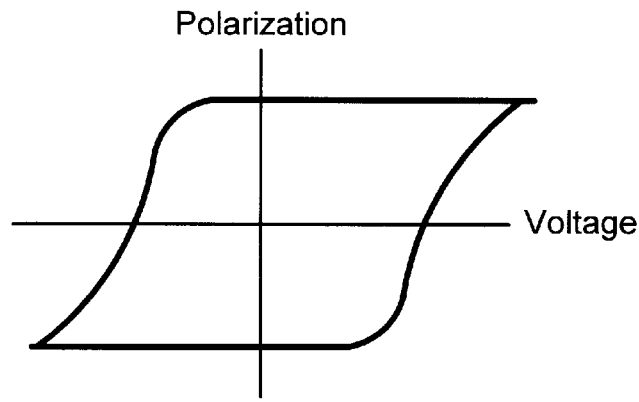
FIG. 2 is an illustration of a hysteresis curve for an FeRAM ferroelectric capacitor.

Each ferroelectric capacitor 20a and 20b includes first and second plates that are separated by a thin layer of ferroelectric material. Each capacitor has a hysteresis curve, which is illustrated in FIG. 2 (the abscissa of the plot indicates voltage applied to the ferroelectric capacitor and the ordinate of the plot indicates polarization of the ferroelectric capacitor). If the polarization is positive, a sufficient negative voltage across the plates will cause the polarization to become negative. Similarly, if the polarization is negative, a sufficient positive voltage applied across the plates will cause the polarization to become positive.

Each access transistor 18a and 18b has a gate connected to the common word line 12. The first access transistor 18a has its drain-source path connected between the shared bit line 14 and the first plate of the first capacitor 20a. The second plate of the first capacitor 20a is connected to the first plate line 16a.

The second access transistor 18b has its drain-source path connected between the shared bit line 14 and the first plate of the second capacitor 20b. The second plate of the second capacitor 20b is connected to the second plate line 16b. Thus, the adjacent memory cells 10a and 10b share the same bit line 14 but are connected to different plate lines 16a and 16b.

Each access transistor 18a and 18b functions as a switch for connecting its corresponding capacitor 20a and 20b to the shared bit line 14. The plate lines 16a and 16b are used in combination with the shared bit line 14 to apply positive and negative voltages to the ferroelectric capacitors 20a and 20b.

Figure 3:
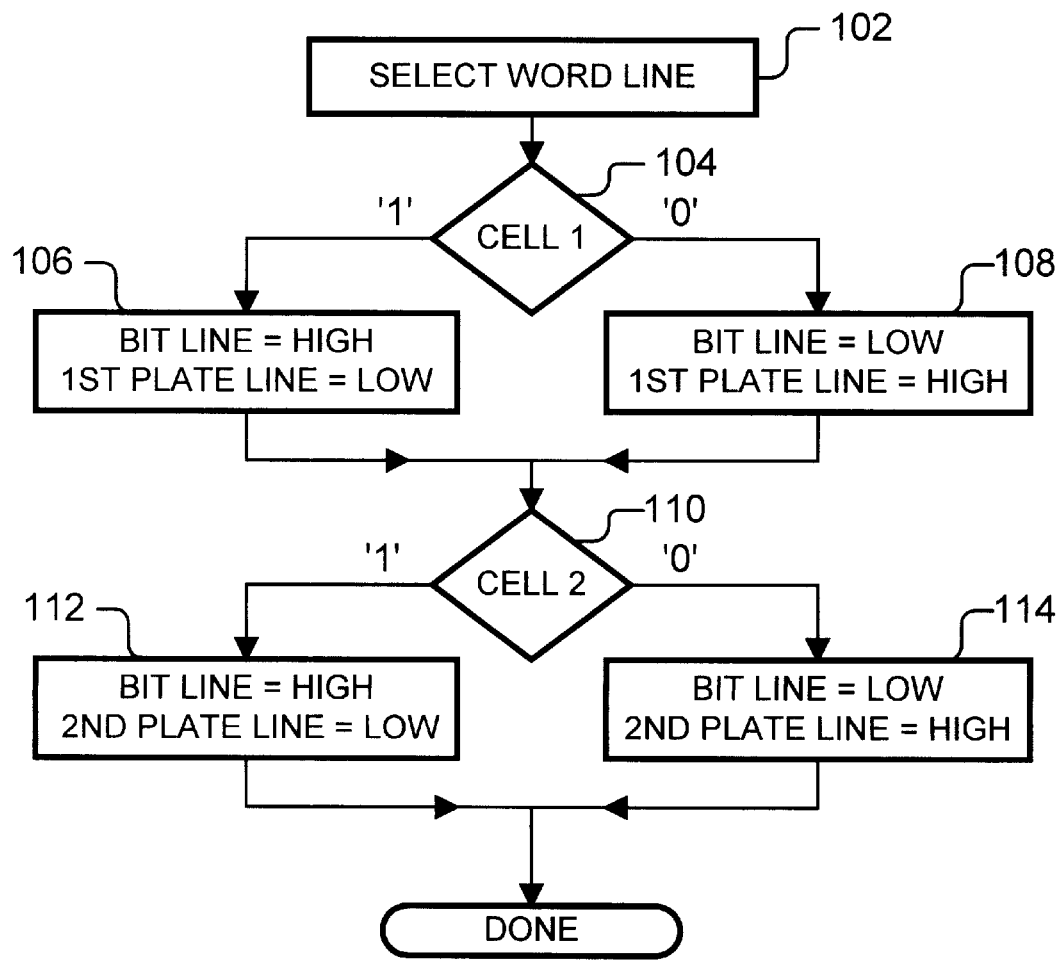
FIG. 3 is a flowchart of a method of writing data to a pair of adjacent memory cells.

Additional reference is now made to FIG. 3, which illustrates a write operation on the first and second memory cells 10a and 10b. The word line 12 is selected to turn on the first and second access transistors 20a and 20b (block 102). If a first binary state (e.g., a logic '1') is to be written to the first memory cell 10a (block 104), the shared bit line 14 is pulled high and the first plate line 16a is pulled to ground (block 106). This causes the polarization of the first ferroelectric capacitor 20a to become positive, which corresponds to the first binary state.

If a second binary state (e.g., a logic '0') is to be written to the first memory cell 10a (block 104), the shared bit line 14 is pulled to ground and the first plate line 16a is pulled high (block 108). This causes the polarization state of the first ferroelectric capacitor 20b to become negative, which corresponds to the second logic state.

A write operation to the second memory cell 10b is performed in a similar manner (block 110 to 114), except that the second plate line 16b is used instead of the first plate line 16a. Thus, use of the first and second plate lines 16a and 16b is mutually exclusive.

Figure 4:
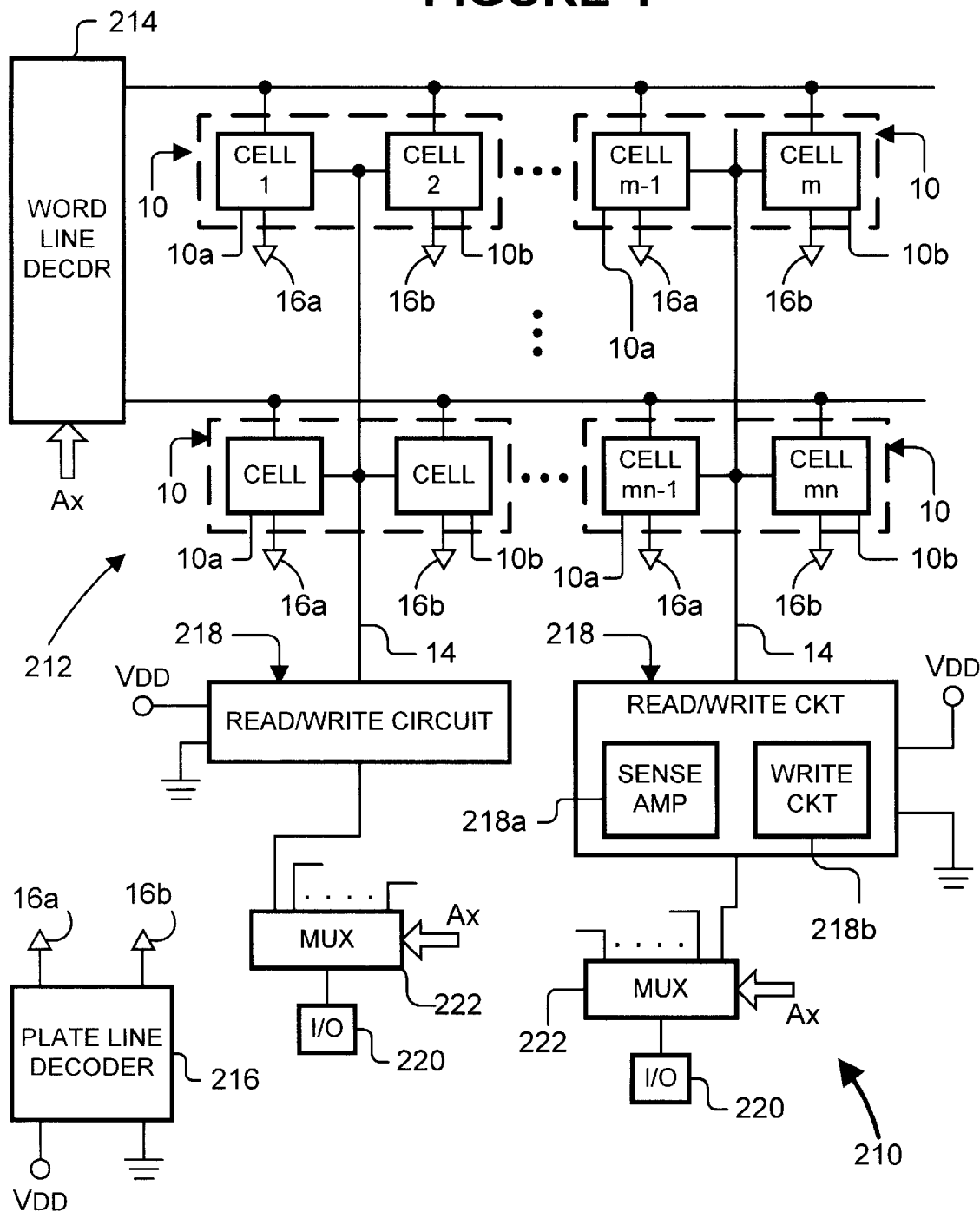
FIG. 4 is an illustration of an FeRAM device having a shared bit line and fragmented plate line architecture.

FIG. 4 is an illustration of an FeRAM device 210 having a shared bit line and fragmented plate line architecture. The FeRAM device 210 includes an m×n array 212 of memory cells 10a and 10b, where m is an integer denoting the number of rows and n is an integer denoting the number of columns.

The FeRAM device 210 further includes a number m of word lines 12, a number n/2 of bit lines 14 and two plate lines 16a and 16b. Pairs 10 of memory cells 10a and 10b in each row are connected to the word lines 12, the shared bit lines 14 and the split plate lines 16a and 16b as described above. Thus, all of the memory cells 10a and 10b in a row are connected to the same word line 12, each pair 10 of memory cells 10a and 10b in a row is connected to a corresponding shared bit line 14, the first memory cell 10a of each pair 10 is connected to the first plate line 16a, and the second memory cell 10b of each pair 10 is connected to the second plate line 16b.

The FeRAM device 210 further includes a word line decoder 214 and a plate line decoder 216. The plate line decoder 216 connects either the first plate line 16a or the second plate line 16b to either a source of operating potential VDD or ground. Either the first plate line 16a or the second plate line 16b is actively used at any one time (that is, active use of the first and second plate lines 16a and 16b is mutually exclusive).

The FeRAM device 210 further includes a number n/2 of read/write circuits 218. Each read/write circuit 218 is connected to a corresponding bit line 14. Therefore, each read/write circuit 218 is shared by adjacent columns of memory cells. Each read/write circuit 218 includes a sense amplifier 218a for sensing the polarization state of a ferroelectric capacitor during a read operation, and a write circuit 218b for controlling the voltage on the corresponding bit line 14 during a write operation. Logically, the sense amplifier 218a and the write circuit 218b are shown as two separate circuits. Physically, however, the sense amplifier 218a and the write circuit 218b may be combined into a single circuit.

Multiple read write/circuits 218 are multiplexed with each I/O pad 220. Each data multiplexer 222 can connect a corresponding I/O pad 220 to a selected one of multiple read/write circuits 218.

During a write operation, a k-bit bit word is supplied to the I/O pads 220 of the FeRAM device 210 and a corresponding write address Ax is supplied to address pads of the device 210. The word line decoder 214 selects a word line in response to the address Ax. Each data multiplexer 222 selects a corresponding read/write circuit 218 in response to the address Ax. Thus, k bits of data are supplied to k selected read/write circuits 218.

The write operation on a selected group of memory cells is performed in two steps: (1) a destructive read of the selected memory cells, followed by (2) a write back to certain selected cells. The destructive read is performed by reading the polarization states of the selected memory cells and then latching the logic values stored in the selected cells. This read is destructive in that it sets the polarization of each selected cell to a known state (e.g., a logic '1').

The write back is then performed by writing back only to those selected cells that need to have their states changed.

Thus, if a binary "01" is stored in first and third memory cells, a "10" will be written to those cells by reading the polarization states of those cells while changing their polarization states to logical "00" and then flipping the polarization state of only the first memory cell. In this manner, a logical "10" may be stored in the first and third memory cells.

If odd-numbered memory cells 10a are connected to the first plate line 16a and even-numbered memory cells 10b are connected to the second plate line 16b, the k-bit word may be written to either k odd-numbered memory cells 10a of a row or k even-numbered memory cells 10b of a row. In this manner, the write operation is interleaved.

During a read operation, an address Ax is supplied to the address pads; the word line decoder 214 selects a word line in response to the address Ax; and the plate line decoder 216 pulls one of the plate lines 16a or 16b high. If the first plate line 16a is pulled high, the sense amplifiers 218a will sense the polarization states of the ferroelectric capacitors connected to the first plate line 16a. If the second plate line 16a is pulled high, the sense amplifiers 218a will sense the polarization states of the ferroelectric capacitors connected to the second plate line 16b. Outputs of the sense amplifiers 218a of the selected cells are multiplexed to the I/O pads 222.

If odd-numbered memory cells 10a are connected to the first plate line 16a and even-numbered memory cells 10b are connected to the second plate line 16b, all k bits of the k-word may be read in parallel from either k odd-numbered memory cells 10a of a row or k even-numbered memory cells 10b of a row. In this manner, the read operation is interleaved.

This architecture and multiplexing selection of different adjacent columns at different times allows a wider—two cell columns wide—read/write circuit 218 to be used for on-pitch designs. Read/write circuits 218 that are two cells wide can be made more sophisticated than single wire pitched read/write circuits; hence, read/write circuit design and complexity is improved. Additionally, the number of read/write circuits 218 of the FeRAM device 210 is cut in half.

The read/write circuits 218 may be "active" read/write circuits disclosed in assignee's U.S. Ser. No. 09/335,241, filed concurrently herewith, entitled "FERROELECTRIC RANDOM ACCESS MEMORY DEVICE INCLUDING ACTIVE READ/WRITE CIRCUIT", and incorporated herein by reference. However, the read/write circuits 218 are not limited to such active circuits. For example, the sense amplifiers 218a may instead use a charge-sharing technique for determining the polarization of the ferroelectric capacitors and, therefore, reading the binary values stored in the memory cells 10a and 10b. The charge-sharing technique could be similar to that used in DRAM devices. A polarization state of the ferroelectric capacitor of a selected memory cell 10a or 10b can be read by selecting the corresponding word line 12 and sensing a charge on the corresponding bit line 14.

Other components of the FeRAM device 210 have not been shown. For example, a timing generator for generating clock signals has not been shown. I/O pads for receiving an address have not been shown either.

Thus disclosed is an FeRAM device having shared bit lines and fragmented plate lines. The shared bit lines allow column wide isolation, which reduces cross talk and/or allows smaller memory cells to be used. Reducing the cross talk improves reliability of accessing memory cells, and using smaller memory cells increases packaging density. Since memory cell density has a direct influence on chip cost, increasing the packaging density reduces chip cost.

The shared bit lines also allow for wider read/write circuit design. Moreover, they allow for read/write circuits to be shared by adjacent columns. This, in turn, reduces the number of read/write circuits.

Additionally bit line sharing reduces the number of bit lines that are used. Reducing the wiring density and reducing the number of components such as amplifiers and bit lines lowers the cost and reproducibility of the device.

Figure 5:
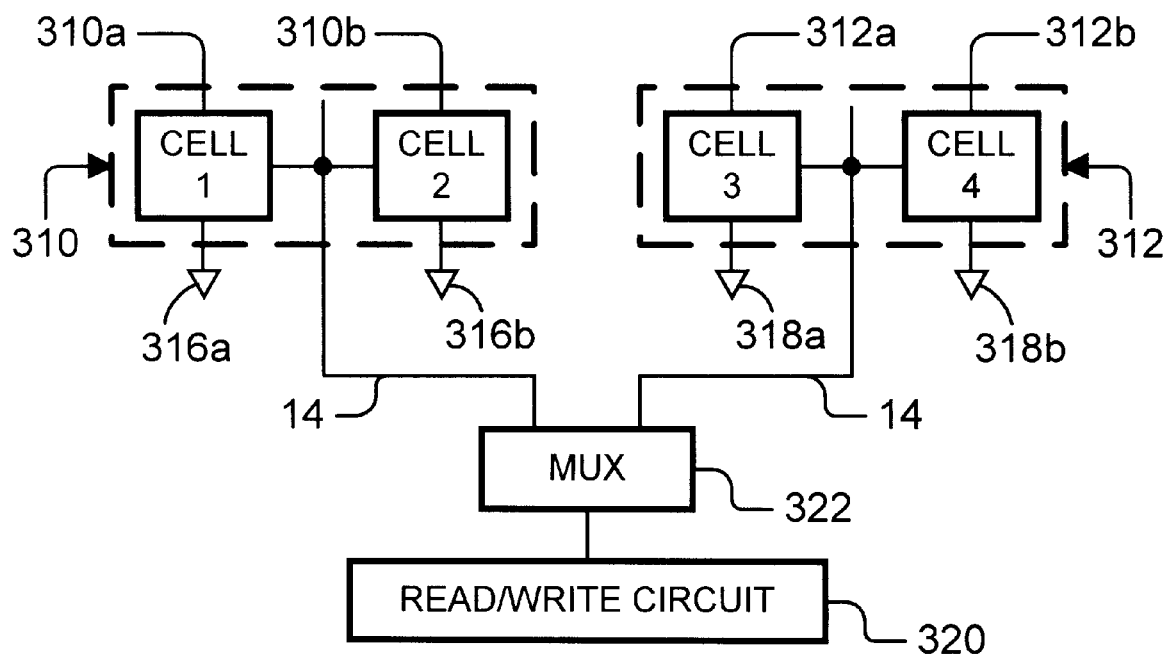
FIG. 5 is an illustration of a row of memory cells having shared bit lines and fragmented plate lines.

Although all of the first memory cells 10a can be connected to a single first plate line 16a and all of the second memory cells 10b can be connected to a single second plate line 16b, the invention is not so limited. FIG. 5 shows four fragmented plate lines 316a and 318a, and 316b and 318b. Thus, for the two pairs 310 and 312 of memory cells shown in FIG. 5, the memory cells 310a, 310b, 312a and 312b are connected to different plate lines 316a, 316b, 318a and 318b. Fragmenting the plate lines would allow for even greater column wide isolation.

Instead of providing a single read/write circuit for each bit line, multiple bit lines may be multiplexed (via a multiplexer 322) into a single read/write circuit 320. Such an architecture increases overhead for the decoding logic but further reduces the number of read/write circuits. However, overhead for the decoding will typically be lower than overhead for the read/write circuits; therefore, size of the FeRAM device will be further reduced.

Figure 6:
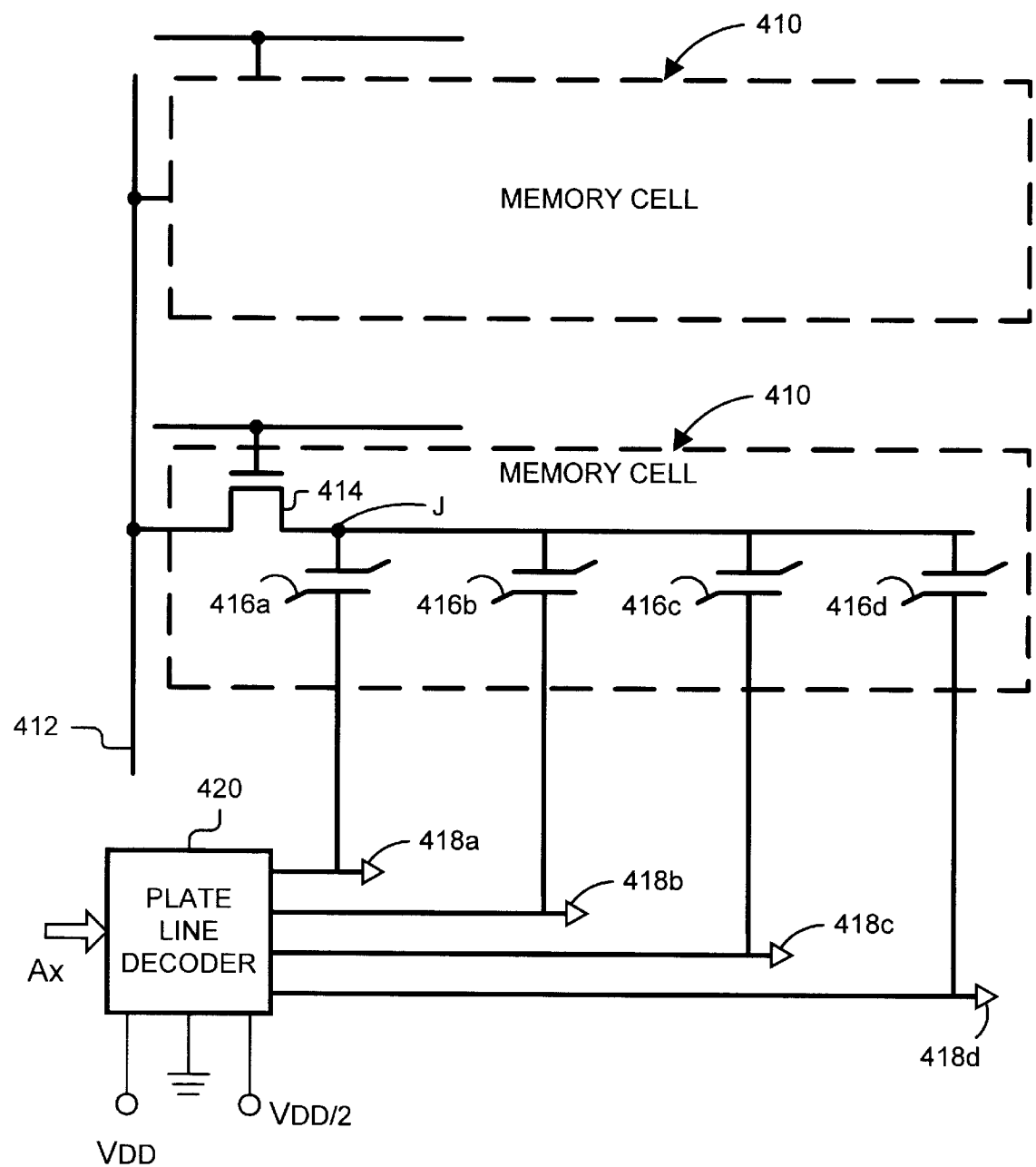
FIG. 6 is an illustration of a memory cell including multiple ferroelectric capacitors and a shared access transistor.

Fragmenting the bit lines also allows the access transistors to be shared. FIG. 6 shows a memory cell 410 in which a bit line 412 and access transistor 414 are shared by four ferroelectric capacitors 416a, 416b, 416c and 416d. The first ferroelectric capacitor 416a is connected between a first plate line 418a and a junction J, and the second ferroelectric capacitor 416b is connected between a second plate line 418b and the junction J. Each of the additional two ferroelectric capacitors 416c and 416d is connected between the junction J and a corresponding plate line 418c and 418d. Thus, the third ferroelectric capacitor 416c is connected between the junction J and a third plate line 418c, and the fourth ferroelectric capacitor 416d is connected between the junction J and a fourth plate line 418d.

To read the polarization state of a selected one of the ferroelectric capacitors 416a, 416b, 416c or 416d, a plate line decoder 420 pulls one of the plate lines high (to voltage level $V_{DD}$) and holds the other three plate lines at an intermediate voltage level (e.g., $V_{DD}/2$). Holding the other three plate lines at the intermediate voltage will ensure that the polarization states of the unselected ferroelectric capacitors don't flip inadvertently. The polarization state of the selected ferroelectric capacitor can then be sensed on the shared bit line 412.

During a write operation on a selected one of the ferroelectric capacitors 416a, 416b, 416c or 416d, the plate line decoder 420 pulls the corresponding plate line either high or low. The plate line decoder 420 also holds the other three plate lines at an intermediate voltage level (e.g., $V_{DD}$).

Thus, the plate lines 418a, 418b, 418c and 418d and plate line decoder 420 are used to select the ferroelectric capacitors 416a, 416b, 416c and 416d of the memory cell 410. Such an architecture allows an on-pitch read/write circuit to span across four columns. Bit line crosstalk and capacitive loading are further reduced because only one bit line is provided for every four columns. This further improves reliability of accessing memory cells.

Cell density is further improved because access transistors are eliminated. This further reduces chip cost.

These advantages become even greater as the number of ferroelectric capacitors per memory cell 410 is increased. Thus, the memory cell 410 of FIG. 6 is not limited to four ferroelectric capacitors. The number of ferroelectric capacitors that can be used will depend partly upon the number of plate lines in the memory device. For example, an FeRAM device having eight plate lines would allow the memory cell 410 to have as many as eight ferroelectric capacitors sharing the same access transistor, an FeRAM device having sixteen plate lines would allow the memory cell 410 to have as many as sixteen ferroelectric capacitors sharing the same access transistor, etc.

The invention is not limited to the specific embodiments described and illustrated above. Instead, the invention is construed according to the claims that follow.

What is claimed is:

1. A ferroelectric random access memory device comprising:
    a plurality of rows of ferroelectric capacitors;
    a plurality of plate lines;
    a plurality of bit lines; and
    a plurality of word lines;
    each row including at least one group of ferroelectric capacitors that share the same bit line and the same word line, the ferroelectric capacitors of each group being connected to different plate lines.

2. The device of claim 1, wherein each group includes first and second access transistors and first and second ferroelectric capacitors, the first transistor coupling the first capacitor to the same bit line, the second transistor coupling the second capacitor to the same bit line.

3. The device of claim 1, wherein each group includes a single access transistor and a number n of ferroelectric capacitors, where integer n≧2, the ferroelectric capacitors of the group being connected between a common junction and different plate lines, the shared access transistor being coupled between the junction and the same bit line.

4. The device of claim 1, further comprising a plurality of sense amplifiers, each sense amplifier being connected to a bit line, whereby each group shares a sense amplifier.

5. The device of claim 1, further comprising a plurality of write circuits, each write circuit being connected to a bit line, whereby each group shares a write circuit.

6. The device of claim 1, further comprising a plurality of active read/write circuits, each active read/write circuit being connected to a bit line, whereby each group shares an active read/write circuit.

7. A memory cell row of a ferroelectric random access memory device, the memory cell row comprising:
    a plurality of memory cell pairs, each memory cell pair including a first memory cell and a second memory cell;
    a word line, the word line being shared by each memory cell in the row;
    at least one first plate line;
    at least one second plate line; and
    a plurality of shared bit lines, each bit line corresponding to a memory cell pair in the row;
    the first memory cell of each pair being connected between its corresponding shared bit line and a first plate line;
    the second memory cell of each pair being connected between its corresponding shared bit line and a second plate line;
    whereby each memory cell pair shares its corresponding bit line and the word line.

8. The memory cell row of claim 7, wherein a single first plate line is connected to all of the first memory cells in the row; and wherein a single second plate line is connected to all of the second memory cells in the row.

9. The memory cell row of claim 7, wherein each first memory cell in the row is connected to one of multiple first plate lines, and wherein each second memory cell in the row is connected to one of multiple second plate lines, whereby the first and second plate lines are fragmented.

10. A ferroelectric random access memory device comprising:
    an m×n array of memory cells, where m is a positive integer denoting a number of rows in the array and n is a positive integer denoting a number of columns in the array,
    at least one first plate line;
    at least one second plate line; and
    a plurality of shared bit lines, each shared bit line corresponding to a pair of adjacent odd-numbered and even-numbered columns;
    for each column pair, memory cells in the odd-numbered column being connected to the corresponding shared bit line and a corresponding first plate line;
    for each column pair, memory cells in the even-numbered column being connected to the corresponding bit line and a corresponding second plate line.

11. The device of claim 10, further comprising a plate line decoder for using the first and second plate lines mutually exclusive of one another.

12. The device of claim 10, wherein a single first plate line is connected to all of the odd-numbered memory cells in the m×n array; and wherein a single second plate line is connected to all of the even-numbered memory cells in the m×n array.

13. The device of claim 10, wherein each memory cell in an odd-numbered column is connected to one of multiple first plate lines, and wherein each memory cell in an even-numbered column is connected to one of multiple second plate lines, whereby the first and second plate lines are fragmented.

14. The device of claim 10, further comprising a plurality of read/write circuits, each read/write circuit being connected to a bit line, whereby each pair of memory cells shares a read/write circuit.

15. A memory cell of a ferroelectric random access memory device, the device having a plurality of bit lines and first and second plate lines, the memory cell comprising:
    a first ferroelectric capacitor connected between the first plate line and a junction;
    a second ferroelectric capacitor connected between the second plate line and the junction; and
    an access transistor having its controlled current path connected between a corresponding bit line and the junction;
    whereby the corresponding bit line and the access transistor are shared by the first and second ferroelectric capacitors.

16. The memory cell of claim 15, further comprising p additional plate lines and p additional ferroelectric capacitors, where p is a positive integer; each additional capacitor being connected between the junction and a corresponding additional plate line, whereby the corresponding bit line and the access transistor are also shared by the additional ferroelectric capacitors.

17. A ferroelectric random access memory device comprising:

an m×n array of memory cells, where m is a positive integer denoting a number of rows in the array and n is a positive integer denoting a number of columns in the array;

first and second plate lines; and a plurality of shared bit lines, each shared bit line being connected to a corresponding column of memory cells;

each memory cell including an access transistor and first and second ferroelectric capacitors;

for each memory cell, the first ferroelectric capacitor being connected between the first plate line and a junction, the second ferroelectric capacitor being connected between the second plate line and the junction; and the access transistor being connected between the junction and the corresponding shared bit line.

18. The device of claim 17, further comprising p additional plate lines and p additional ferroelectric capacitors for each memory cell, where p is a positive integer; each additional capacitor being connected between the junction of its corresponding memory cell and a corresponding additional plate line.

19. The device of claim 17, further comprising a plate line decoder for using the plate lines mutually exclusive of one another.

20. The device of claim 17, further comprising a plurality of read/write circuits, each read/write circuit being connected to a bit line, whereby the ferroelectric capacitors of each memory share a read/write circuit.

* * * * *